United States Patent
Matsuura et al.

(10) Patent No.: US 7,696,917 B2
(45) Date of Patent: Apr. 13, 2010

(54) ENCODE CIRCUIT AND ANALOG-DIGITAL CONVERTER COMPRISING A DIGITAL AVERAGE UNIT AND A LOGICAL BOUNDARY DETECTION UNIT

(75) Inventors: Kouji Matsuura, Chiba (JP); Koichi Ono, Kanagawa (JP); Kiyoshi Makigawa, Kanagawa (JP)

(73) Assignee: Sony Corporation (JP)

( * ) Notice: Subject to any disclaimer, the term of this patent is extended or adjusted under 35 U.S.C. 154(b) by 349 days.

(21) Appl. No.: 11/798,098

(22) Filed: May 10, 2007

(65) Prior Publication Data

US 2007/0262887 A1 Nov. 15, 2007

(30) Foreign Application Priority Data

May 11, 2006 (JP) ............................. 2006-132550

(51) Int. Cl.
*H03M 1/36* (2006.01)

(52) U.S. Cl. ...................................... 341/160; 341/155
(58) Field of Classification Search .......... 341/155–170
See application file for complete search history.

(56) References Cited

U.S. PATENT DOCUMENTS

| | | | | |
|---|---|---|---|---|
| 6,433,725 B1 * | 8/2002 | Chen et al. | ................... | 341/160 |
| 6,590,518 B1 * | 7/2003 | Taft | ............................ | 341/156 |
| 7,286,072 B2 * | 10/2007 | Sakata et al. | ................ | 341/155 |
| 7,327,292 B2 * | 2/2008 | Lee et al. | .................... | 341/155 |

OTHER PUBLICATIONS

R. E. J. Van De Grift et al., "An 8-bit Video ADC Incorporating Folding and Interpolation Techniques," IEEE Journal of Solid-State Circuits, vol. 22, Issue 6, Dec. 1987, pp. 944-953.

* cited by examiner

*Primary Examiner*—Lam T Mai
(74) *Attorney, Agent, or Firm*—Rader Fishman & Grauer PLLC; Ronald P. Kananen (57) ABSTRACT

An encode circuit includes a digital average unit that receives cyclic thermometer codes or standard thermometer codes, and that reduces a bubble error in the received thermometer codes by a majority vote rule, a logical boundary detection unit that detects a logical boundary in the thermometer codes output from the digital average unit, and an encoder unit that generates output codes based on output signals from the logical boundary detection unit.

15 Claims, 12 Drawing Sheets

| I1 | I2 | I3 | D |
|---|---|---|---|
| L | L | L | L |
| L | L | H | L |
| L | H | L | L |
| L | H | H | H |
| H | L | L | L |
| H | L | H | H |
| H | H | L | H |
| H | H | H | H |

FIG. 11

| CYCLIC THERMOMETER CODE IN IDEAL CONDITION | DIGITAL AVERAGE UNIT INPUT WHICH INCLUDES BUBBLE ERROR | DIGITAL AVERAGE UNIT OUTPUT FROM WHICH BUBBLE ERROR IS REMOVED |
|---|---|---|
| 1 | CP7 | A7 1 |
| 1 | CP6 | A6 1 |
| 1 | CP5 | A5 1 |
| 0 | CP4 | A4 0 |
| 0 | CP3 | A3 0 |
| 0 | CP2 | A2 0 |
| 0 | CP1 | A1 0 |
| 0 | CP0 | A0 0 |

FIG. 12

| CYCLIC THERMOMETER CODE IN IDEAL CONDITION | DIGITAL AVERAGE UNIT INPUT WHICH INCLUDES TWO BUBBLE ERRORS | DIGITAL AVERAGE UNIT OUTPUT | LOGICAL BOUNDARY DETECTION UNIT OUTPUT | |
|---|---|---|---|---|
| 1 | CP7 | 1 | A7 | WL7 | 0 |
| 1 | CP6 | 1 | A6 | WL6 | 0 |
| 1 | CP5 | 1 | A5 | WL5 | 0 |
| 0 | CP4 | 0 | A4 | WL4 | 1 |
| 0 | CP3 | 0 | A3 | WL3 | 0 |
| 0 | CP2 | 1 | A2 | WL2 | 1 |
| 0 | CP1 | 1 | A1 | WL1 | 0 |
| 0 | CP0 | 0 | A0 | WL0 | 1 |

|  | LOWER-ORDER → | CYCLIC THERMOMETER CODE | ← HIGHER-ORDER |

ENCODE CIRCUIT AND ANALOG-DIGITAL CONVERTER COMPRISING A DIGITAL AVERAGE UNIT AND A LOGICAL BOUNDARY DETECTION UNIT

BACKGROUND OF THE INVENTION

1. Field of the Invention

The present invention relates to an encode circuit used for a high-speed A/D (Analog-Digital) converter. More particularly, the present invention provides an encoding method, efficient for the cyclic thermometer codes used for a high-speed folding-type A/D converter that uses an A/D conversion method whose resolution can be increased easier than that of a flash type A/D converter, and an encode circuit that uses cyclic thermometer codes.

The present application contains subject matter related to Japanese Patent Application JP 2006-132550 filed in the Japanese Patent Office on May 11, 2006, the entire content of which being incorporated herein by reference.

2. Description of Related Art

Figure 15:
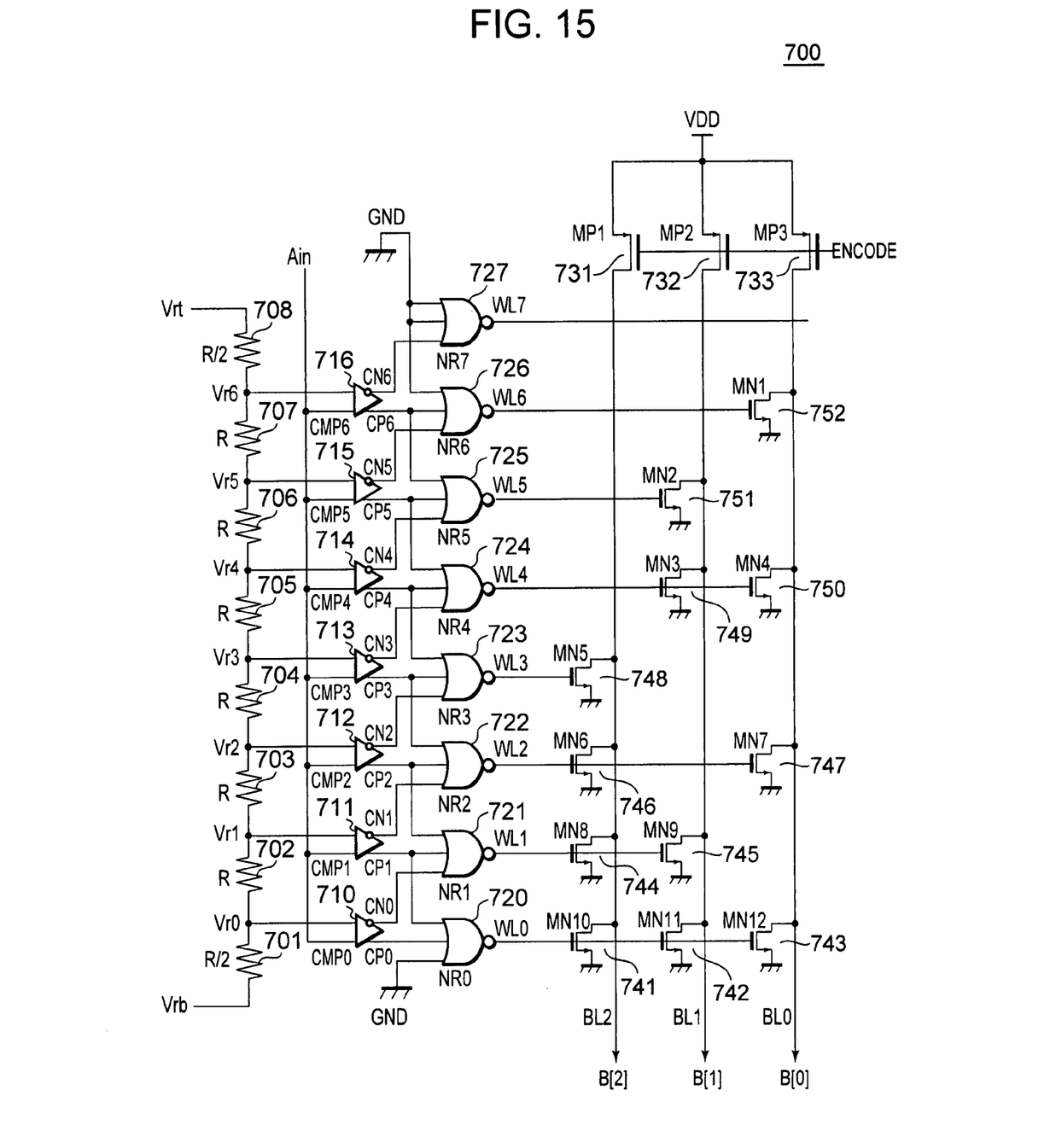
FIG. 15 is a circuit diagram showing the encode circuit of a flash A/D converter of related art.

FIG. 15 shows the configuration of a flash-type A/D (Analog to Digital) converter, which outputs 3-bit binary code, as an example of a high-speed A/D converter of related art. As shown in FIG. 15, a standard flash-type A/D converter 700 includes comparator units, 710-716, that compare an analog input signal Ain with a reference voltage generated by a ladder of resistors 701-708 to generate thermometer codes corresponding to the magnitude of the input signal, logical boundary detection unit, 720-727, that detects the logical boundary point between 1 and 0 in the thermometer codes, and an encoder unit, 731-733 and 741-751, that outputs binary code B[2:0] based on the output signal from the logical boundary detection unit.

In the comparator unit composed of comparators 710-716, the voltage between the high-voltage side reference voltage Vrt and the low-voltage side reference voltage Vrb is divided by the ladder of eight resistors 701-708 into seven reference voltages Vr0-Vr6. The resistance value of the resistors 701 and 708 at both ends is set to the half of the value of other resistors. The analog input signal Ain is compared with the seven divided reference voltages by the seven comparators CMP0-CMP6 (710-716).

When the analog input signal Ain is higher than the reference voltage Vr0-Vr6, the output signal CP0-CP6 of the comparators CMP0-CMP6 (710-716) is set to 1 and the output signal CN0-CN6 is set to 0. Conversely, when Ain is lower than the reference voltage Vr0-Vr6, the output signal CN0-CN6 is set to 1 and the output signal CP0-CP6 is set to 0. Therefore, when Ain is higher than the reference voltage Vr3 but lower than Vr4, the thermometer codes are generated as follows: CP0-CP3 are set to 1, CP4-CP6 are set to 0, CN0-CN3 are set to 0, and CN4-CN6 are set to 1.

In the logical boundary detection unit, the thermometer code outputs CP0-CP6 and CN0-CN6 from the comparator unit CMP0-CMP6 (710-716) are supplied to three-input NOR circuits NR0-NR7 (720-727), as shown in FIG. 15. The output signals CNi−1, CPi, and CPi+1 of a comparator are input to NRi (i is an integer). That is, only when (CPi−1, CPi, CPi+1)=(1, 0, 0), the output of NRi is 1 and the point at which a sequence of 1 is changed to a sequence of 0 is output as the logical boundary point.

The encoder unit includes PMOS transistors MP1-MP3 (731-733), which pre-charge bit lines BL0-BL2 to the power supply voltage VDD by setting the Encode signal to the L level, and NMOS transistors MN1-MN12 (741-751) which pull down the corresponding bit of the pre-charged bit lines BL0-BL2 to GND (ground), based on output word lines WL0-WL7 from the logical boundary detection unit, to give desired binary outputs B0-B2.

Therefore, when the input signal Ain, which is higher than the reference voltage Vr3 but lower than Vr4, is received after the Encode signal is set to "L" level to pre-charge the bit lines BL0-BL2 to the power supply voltage VDD, only word line WL4 is set to the H level by the logical boundary detection unit and the NMOS transistors MN3 (748) and MN4 (749) are turned on. At this time, when the Encode signal is set to the H level, bit lines BL1 and BL0 are pulled down to GND and the encoded binary signal B[2:0]=100 is output. Note that B[2:0] indicates three-bit data ranging from 2 to 0.

In an A/D converter that uses such thermometer codes, there is a bubble error in the thermometer codes which needs to be handled with care. For example, in the comparator outputs CP0-CP, as shown in FIG. 15, there should be only one point where the value changes between 1 and 0 such as 1111100. A bubble error refers to two or more points of change between 1 and 0 in the comparator outputs, such as 1011100. This bubble error turns on two or more word lines at the same time and so generates a large error in the output code.

However, when the standard thermometer codes are used, the output of a three-input NOR circuit is 1 only when three continuous values of the thermometer codes is (1, 0, 0) as in the configuration of the logical boundary detector shown in FIG. 15. For example, even if the comparator outputs from CMP0-CMP6 (710-716) in FIG. 15 become 1011100 due to a bubble error, only NR5 (725) out of NR0-NR7 (720-727) outputs 1 and, therefore, the same binary code is output as when the comparator output of CMP0-CMP6 (710-716) is 1111100.

In contrast to the A/D converter described above, a folding-type A/D converter, known as another high-speed A/D converter comparable to the flash-type A/D converter, and cyclic thermometer codes are disclosed by ROB E. J, VAN DE GRIFT et al. in "An 8-bit video ADC incorporating folding and interpolation techniques" (IEEE Journal of Solid-State Circuits, Volume 22, Issue 6, December 1987, pp. 944 953).

Figure 16:
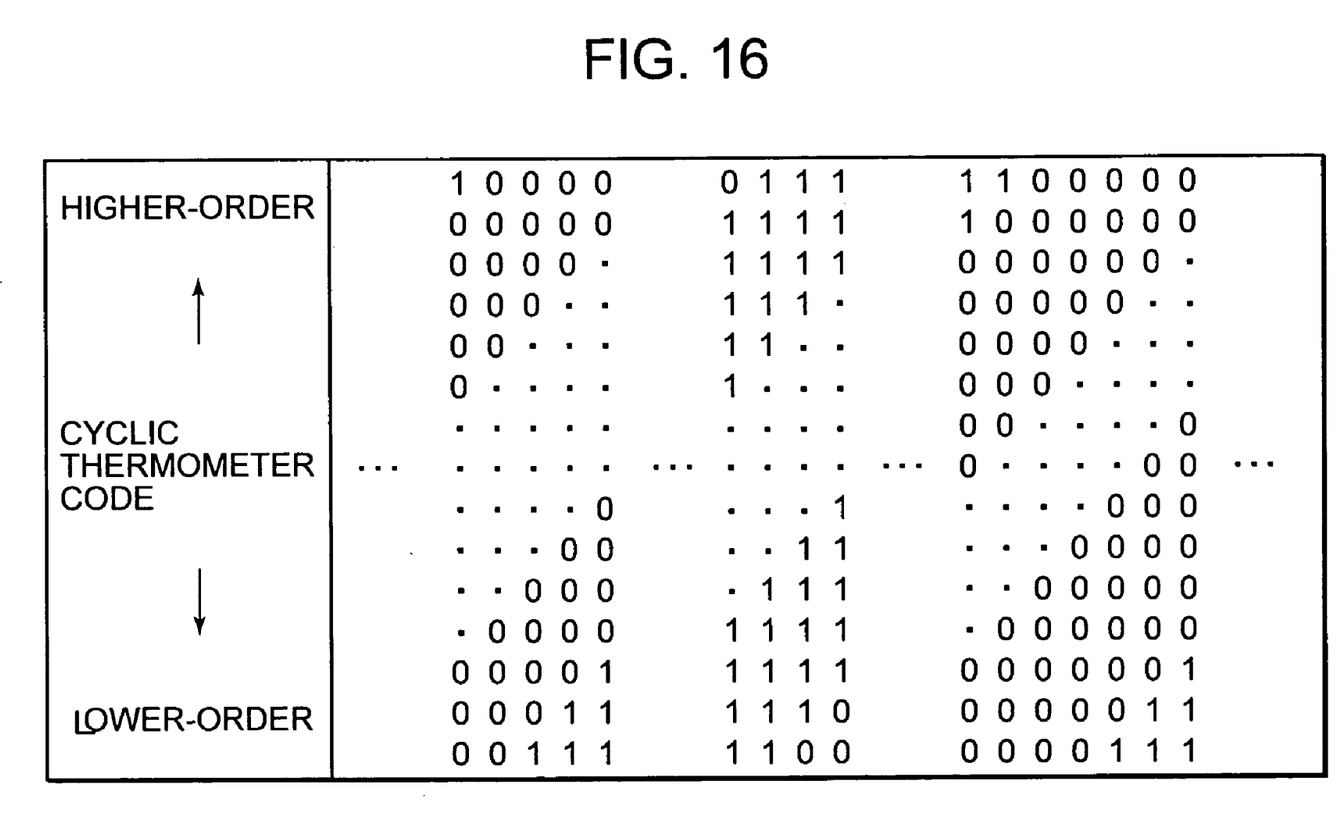
FIG. 16 is a logic table showing the operation of the encode circuit in FIG. 15.

As shown in FIG. 16, these cyclic thermometer codes are codes generated by a repetitive operation in which the codes are sequentially filled with 1 beginning with the lower-order side of the cyclic thermometer codes from the comparators and, when the codes are all filled with 1, the codes are sequentially filled with 0 beginning with the lower-order side and, when the codes are all filled with 0, the codes are sequentially filled with 1 again beginning with the lower-order side. Because there is only one point of change from 1 to 0 or from 0 to 1 between each two neighboring values, this code system is especially suited for an A/D converter used in high-speed operation.

SUMMARY OF THE INVENTION

When the logical boundary detection unit of related art such as that shown in FIG. 15 are used for the cyclic thermometer codes described above, a bubble error can be processed correctly if the error occurs in the normal thermometer codes, such as 0111100 or 1101110, output from the comparators CP0-CP6 in FIG. 15, where the code is filled with 1 beginning with the lower-order bit side. However, for a bubble error specific to the cyclic thermometer codes, where the code is filled with 0 beginning with the lower-order bit side such as 1000011 or 0100111, there are two points where H-level output is received from the logical boundary detection unit and, therefore, the encoding operation may not be performed correctly.

In view of the foregoing, it is desirable to provide an A/D converter, especially a folding-type A/D converter that can perform encoding correctly at a logical boundary even if the cyclic thermometer codes are used. The present invention is made in view of the above described circumstances.

An encode circuit according to an embodiment of the present invention includes a digital average unit that receives cyclic thermometer codes or standard thermometer codes and reduces a bubble error in the received thermometer codes by a majority vote rule; a logical boundary detection unit that detects a logical boundary in the thermometer codes output from the digital average unit; and an encoder unit that generates output codes based on output signals from the logical boundary detection unit.

An analog-digital converter according to another embodiment of the present invention includes a first analog-digital conversion unit that outputs digital signals of a first bit group. The first analog-digital conversion unit includes a resistor ladder in which a plurality of resistors are connected for generating reference voltages from connection points of the resistors; folding circuits that generate folding waveforms corresponding to the reference voltages supplied from the resistor ladder, and an input signal; an interpolation circuit that interpolates outputs of the folding circuits that neighbor each other; a comparator that determines a magnitude relation between outputs of the interpolation circuit; a digital average unit that corrects an error in an output result of the comparator by a majority vote rule; a logical boundary detection unit that detects a changing point in data output from the digital average unit; and an encoder unit that converts data to binary codes according to an output of the logical boundary detection unit.

The encode circuit according to the present invention, which can be implemented by an extremely small logic circuit capable of high-speed operation, is applicable directly to the standard thermometer codes.

In addition, the encode circuit according to the present invention is applicable to a high-speed A/D converter. The encode circuit is especially suitable for a reduction of bubble errors in a folding-type A/D converter that uses an A/D conversion method whose resolution can be increased more easily than that of a flash-type A/D converter.

DETAILED DESCRIPTION OF EMBODIMENTS

Figure 1:
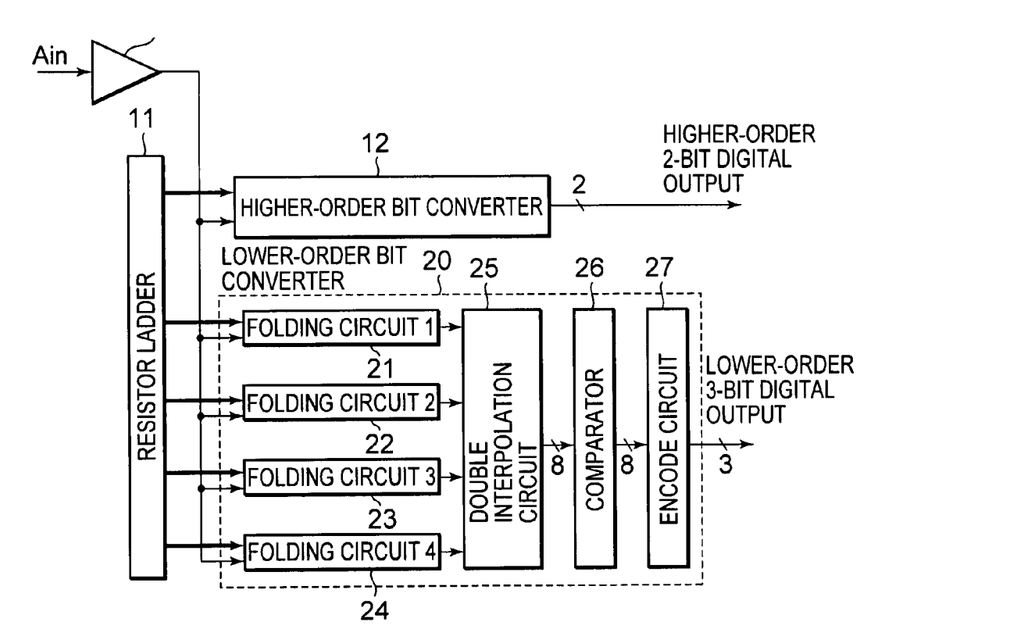
FIG. 1 is a diagram showing the block configuration of an analog-digital converter in a first embodiment.

FIG. 1 shows the block configuration of a 5-bit folding-type A/D converter 50 that is one of embodiments using an encode circuit of the present invention.

As shown in FIG. 1, the folding-type A/D converter 50 includes a track & hold circuit 10, a resistor ladder 11, a higher-order bit converter 12, and a lower-order bit converter 20. The lower-order bit converter 20 includes folding circuits 21-24, a double interpolation circuit 25, a comparator 26, and an encode circuit 27.

The output of the track & hold circuit 10 is connected to the input of both the higher-order bit converter and the lower-order bit converter.

The higher-order bit converter 12, which performs the analog-digital conversion operation for the higher-order bits, usually has two or three bits, and a circuit such as a flash-type A/D converter is used for the higher-order bit converter 12.

The lower-order bit converter 20 has more bits than the higher-order bit converter 12. The folding method is used primarily for the lower-order bit converter.

The folding circuits 21-24 generate folding waveforms each of which becomes the H level and the L level repeatedly as the input analog signal changes for multiple reference voltages that are different to each other. The detailed circuit configuration and the operation will be described later.

The double interpolation circuit 25 creates a folding waveform generated by interpolating the neighboring folding waveforms. The circuit configuration and the operation will be described later.

The comparator 26 outputs 1 if the differential output of the folding circuits is larger than 0, and 0 if the differential output is smaller than 0.

The encode circuit 27 generates binary data from the cyclic thermometer codes output from the comparator 26 and, in the example in FIG. 1, outputs lower-order bit digital data.

Next, the following describes the operation of the folding-type A/D converter 50 shown in FIG. 1. When the analog input signal Ain is supplied to the track & hold circuit 10, its output signal is supplied to the higher-order bit converter and the lower-order bit converter. The analog signal input to the higher-order bit converter 12 is compared by the comparators with the reference voltages for the higher-order two bits supplied from the resistor ladder circuit 11, and the comparison result, either H level or L level, is output. A logical boundary detection unit detects the changing point between the H level and the L level output from the comparators, the result is supplied to an encode circuit for conversion to binary data, and higher-order two bits are output.

On the other hand, the output of the track & hold circuit, which is input to the lower-order bit converter 20, is first input to the folding circuits 21-24 and is compared with the reference voltages output from the resistor ladder circuit 11. FIG. 1 shows a lower-order bit converter for three bits. In this converter, there are four folding circuits 21-24. The outputs of the four folding circuits are interpolated by the double interpolation circuit 25 to output a total of eight folding waveforms, 0-7, and the values are compared by the comparator 26 to determine their value relation. The comparator 26 is immediately followed by a digital average circuit which corrects a transition error. The logical boundary detection unit detects a logical changing point in the corrected eight data pieces and outputs the changing point to the encode circuit 27 for conversion to binary data.

In the present specification, the highest-order bit may be referred to as the Most Significant Bit, and the lowest-order bit as the Least Significant Bit.

Figure 2:
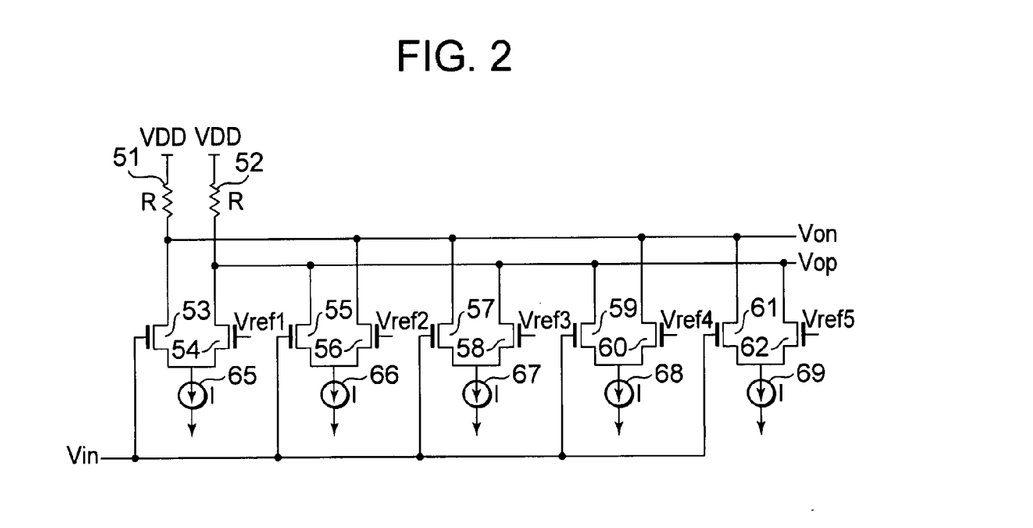
FIG. 2 is a diagram showing the circuit configuration of a folding circuit in FIG. 1.

FIG. 2 shows an example of the circuit configuration of the folding circuits 21-24 shown in FIG. 1.

Folding circuits 100 (21-24) in FIG. 2 are configured, for example, by MOS transistors. A resistor (51) is connected between the power supply (VDD) and a terminal Von, the terminal Von is connected to the drain of an NMOS transistor 53, the gate of the NMOS transistor 53 is connected to a terminal Vin, and the source is connected to one of the terminals of a current generator I 65. The other terminal of the current generator I 65 is connected to the reference potential, for example, the ground. A resistor (52) is connected between the power supply (VDD) and a terminal Vop, and the terminal Vop is connected to the drain of an NMOS transistor 54. The gate of the NMOS transistor 54 is connected to a terminal where a reference voltage Vref1 is supplied, and the source is connected in common to the source of the NMOS transistor 53.

The drain of an NMOS transistor 55 is connected to the terminal Vop, the gate is connected to the terminal Vin, and the source is connected to one of the terminals of a current generator I 66. The drain of an NMOS transistor 56 is connected to the terminal Von, the gate is connected to a terminal where a reference voltage Vref2 is supplied, and the source is connected in common to the source of the NMOS transistor 55. The other terminal of the current generator I 66 is connected to the reference potential, for example, the ground.

The drain of an NMOS transistor 57 is connected to the terminal Von, the gate is connected to the terminal Vin, and the source is connected to one of the terminals of a current generator I 67. The drain of an NMOS transistor 58 is connected to the terminal Vop, the gate is connected to a terminal where a reference voltage Vref3 is supplied, and the source is connected in common to the source of the NMOS transistor 57. The other terminal of the current generator I 67 is connected to the reference potential, for example, the ground.

The drain of an NMOS transistor 59 is connected to the terminal Vop, the gate is connected to the terminal Vin, and the source is connected to one of the terminals of a current generator I 68. The drain of an NMOS transistor 60 is connected to the terminal Von, the gate is connected to a terminal where a reference voltage Vref4 is supplied, and the source is connected in common to the source of the NMOS transistor 59. The other terminal of the current generator I 68 is connected to the reference potential, for example, the ground.

The drain of an NMOS transistor 61 is connected to the terminal Von, the gate is connected to the terminal Vin, and the source is connected to one of the terminals of a current generator I 69. The drain of an NMOS transistor 62 is connected to the terminal Vop, the gate is connected to a terminal where a reference voltage Vref5 is supplied, and the source is connected in common to the source of the NMOS transistor 61. The other terminal of the current generator I 69 is connected to the reference potential, for example, the ground.

The reference voltages Vref1-Vref5 are voltages generated by dividing the voltage between the highest reference voltage and the lowest reference voltage by the resistor ladder into voltages at predetermined intervals. The voltages are all different and are sequentially increased from Vref1 to Vref5.

Figure 3:
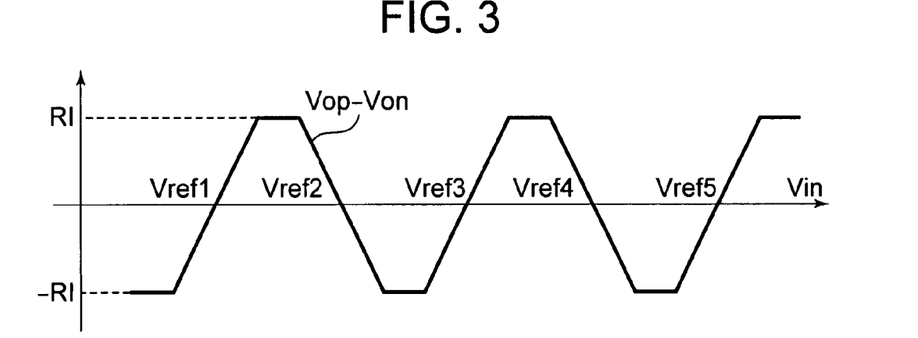
FIG. 3 is a waveform diagram showing the operation of the folding circuit in FIG. 2.

Next, the following describes the operation of the folding circuit 100 with reference to the waveform diagram shown in FIG. 3. The folding circuit 100 corresponds to the folding circuit 21 shown in FIG. 1. As shown in FIG. 2, the folding circuit includes five differential pairs having five tail currents I of the current generators 65-69. Each differential pair receives the voltage from the input terminal Vin and the reference voltage, one of Vref1-Vref5, from the resistor ladder. Connecting those differential pairs to the load resistors (51, 52), as shown in FIG. 2, produces the voltage difference Vop-Von, as shown in FIG. 3, where Vop-Von is the difference between Vop and Von that are the output signals of the folding circuit 100. The difference Vop-Von is a folding waveform that has five 0-voltage crossings at Vref1-Vref5 and has the amplitude of RI. This is the output of the folding circuit 100.

Figure 4:
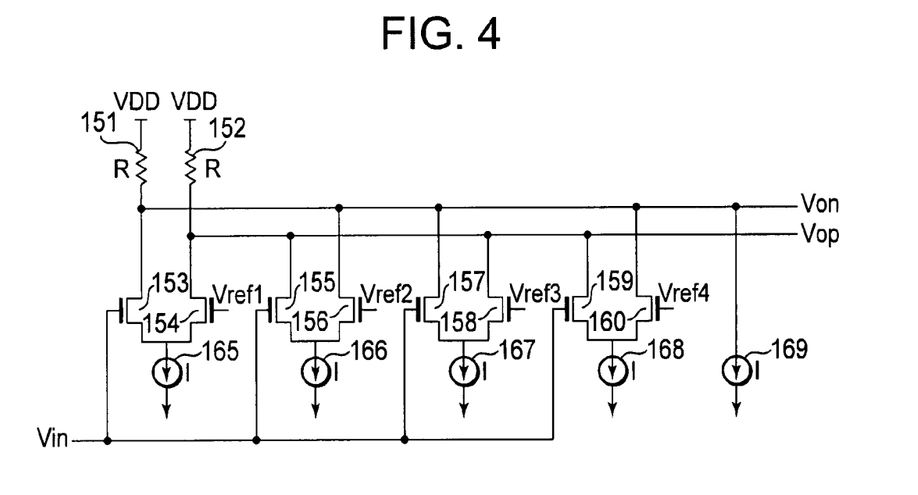
FIG. 4 is a diagram showing the circuit configuration of another folding circuit.

FIG. 4 shows the circuit configuration of a folding circuit 150 in another embodiment. This folding circuit 150 corresponds to the folding circuits 22-24 shown in FIG. 1. In addition, this folding circuit 150 is a modification of the folding circuit 100 in FIG. 2 with the fifth-stage differential pair (circuit) in FIG. 2 replaced by a current generator.

That is, the differential pairs (circuits) are configured by the pairs including NMOS transistors 153 and 154, NMOS transistors 155 and 156, NMOS transistors 157 and 158, and NMOS transistors 159 and 160. The drains of the NMOS transistors 153, 156, 157, and 160 are connected in common to the terminal Von and, via a resistor R (151), connected to the power supply (VDD). The drains of the NMOS transistors 154, 155, 158, and 159 are connected in common to the terminal Vop and, via a resistor R (152), connected to the power supply (VDD)

The reference voltages Vref1, Vref2, Vref3, and Vref4 are connected respectively to the gates of the NMOS transistors 154, 156, 158, and 160, the sources of the NMOS transistor pairs, which constitute the differential circuit, are connected in common to current generators (I 165-I 168), respectively.

One of the terminals of a current generator I 169 is connected to the common connection point Von between the resistor R (151) and the drains of the NMOS transistors 153, 156, 157, and 160, and the other terminal is connected to the reference potential, for example, the ground.

Figure 5:
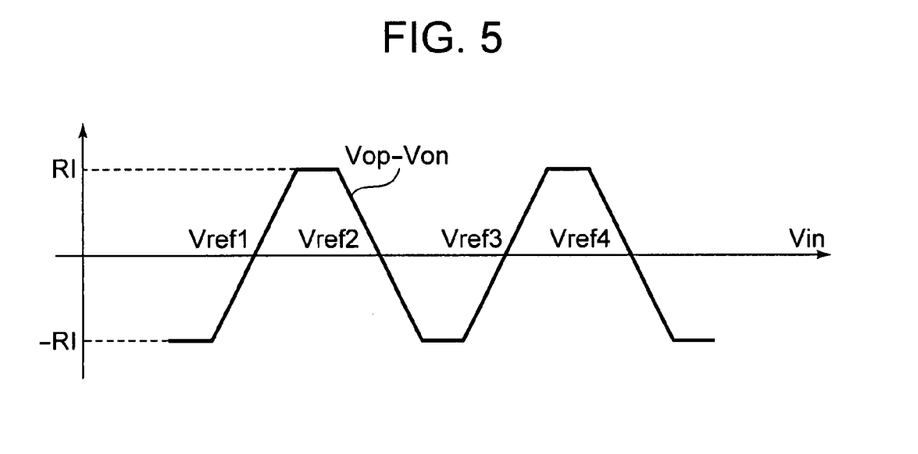
FIG. 5 is a wave form diagram showing the operation of the folding circuit shown in FIG. 4.

As described above, the folding circuit 150 includes four differential circuits having tail current I and one current generator having the current value I. The difference Vop-Von between Vop and Von, which are the output signals of the folding circuits 22-24 shown in FIG. 1, has a waveform that has four zero crossings at reference voltages Vref1-Vref4 and that have the amplitude of RI, as shown in FIG. 5.

Figure 6:
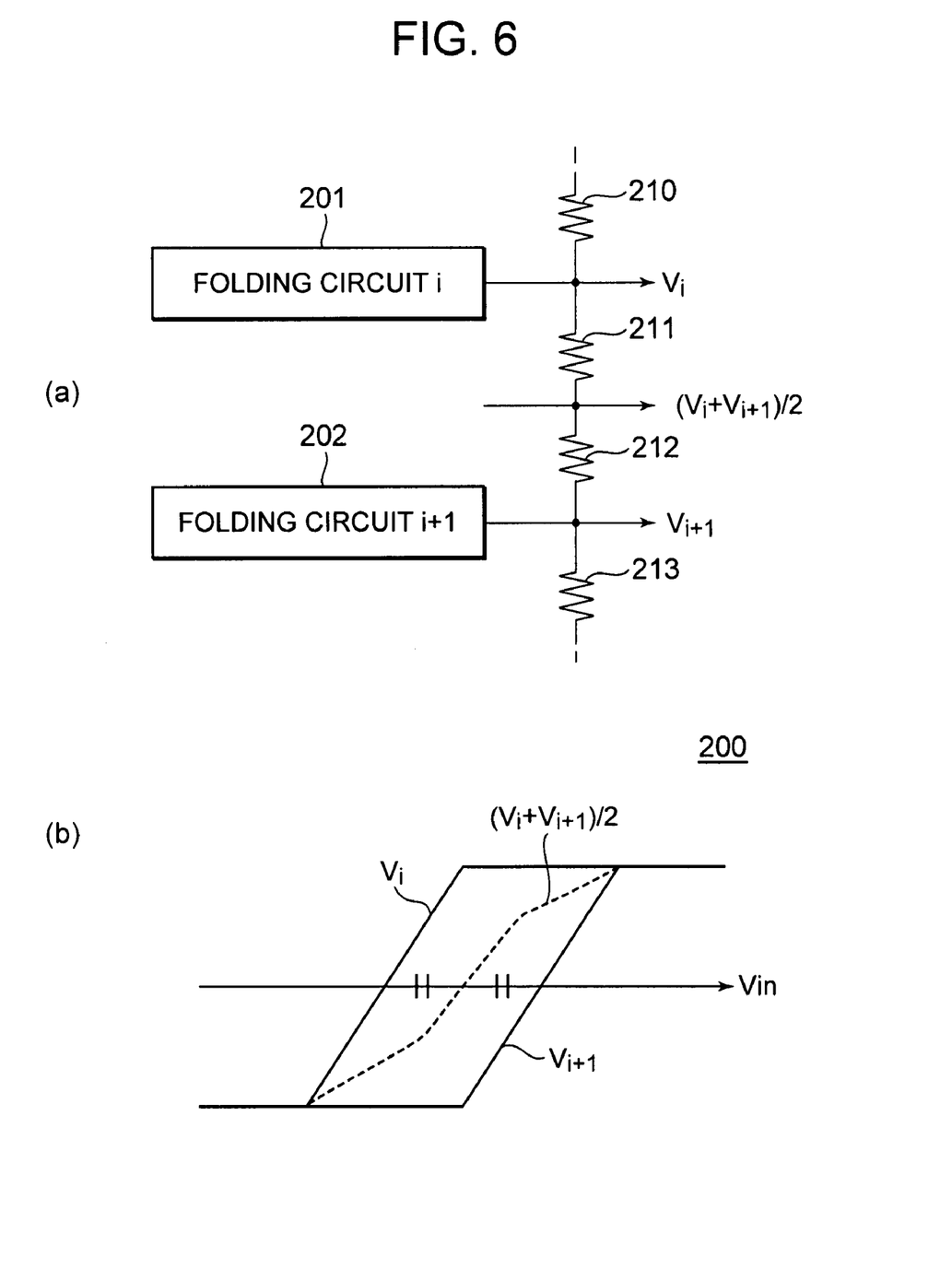
FIG. 6 is a diagram showing the circuit configuration of a double interpolation circuit shown in FIG. 1.

Next, FIG. 6 shows the circuit configuration of an interpolation circuit 200. The interpolation circuit 200 that receives the output Vi of a folding circuit i (201) and the output Vi+1 of a folding circuit i+1 (202) performs the following operation. For example, the double interpolation circuit in this embodiment divides the outputs of the neighboring folding circuits 201 and 202 by resistors 211 and 212, as shown in FIG. 6A, to generate the interpolation signal (Vi+Vi+1)/2 having a zero crossing point in the middle point between Vi and Vi+1, as shown in FIG. 6B.

Figure 7:
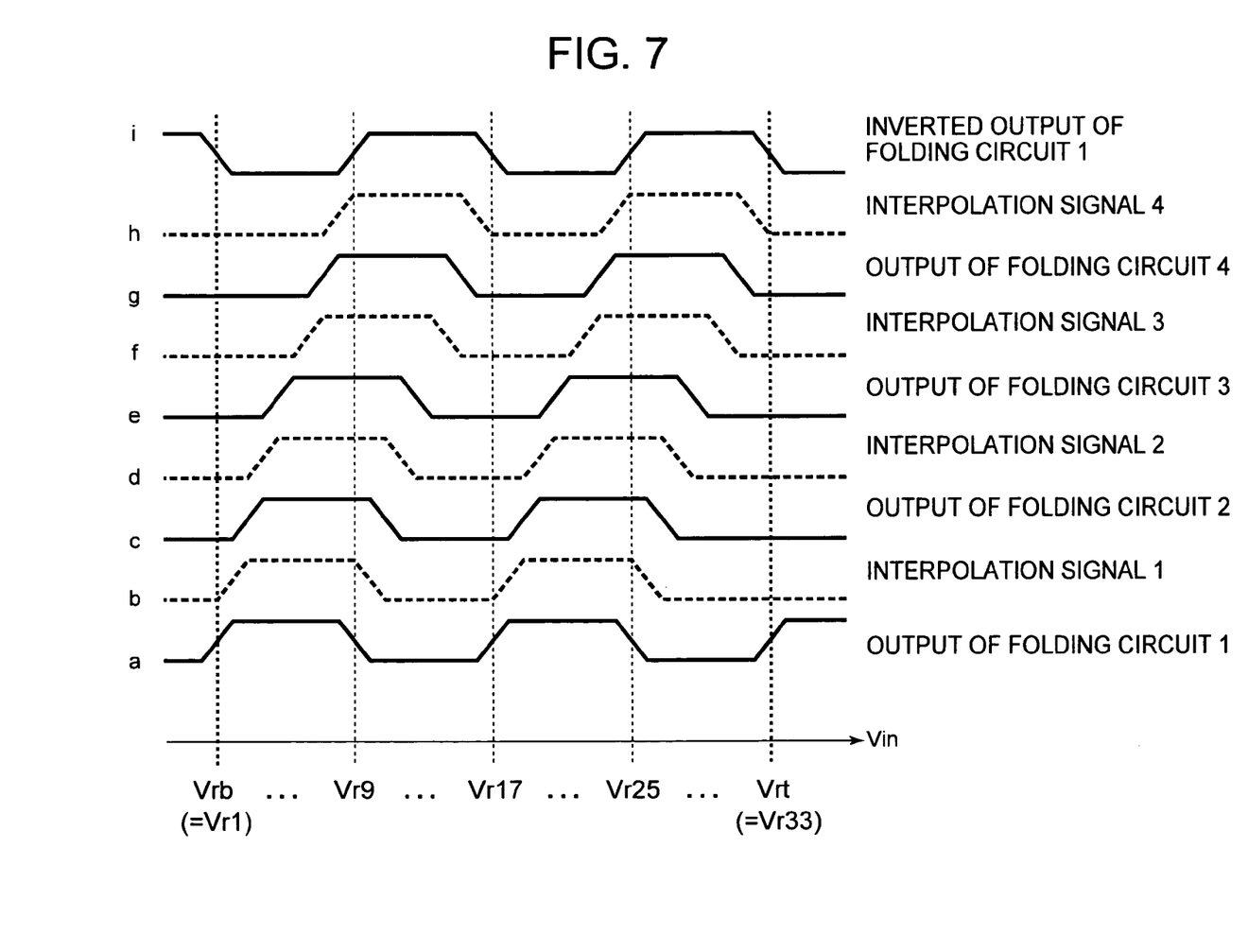
FIG. 7 is a waveform diagram showing all the folding waveforms that are generated.

By performing this interpolation, a total of eight folding waveforms of the signals are generated, as shown in FIG. 7:

that is, the four folding waveforms of the signals a, c, e, and g output from the folding circuits 21-24 and the four folding waveforms of the signals b, d, f, and h generated by the interpolation. This means that, in the interval from the low-potential side reference voltage Vrb(=Vr1) to the high-potential side reference voltage Vrt (=Vr33), the zero-crossing points are generated at 32+1 reference potentials produced by the division of 32 that is the resolution of five bits. The eight folding waveforms are input to eight comparators and the magnitude relation at the zero crossing points is determined to generate the cyclic thermometer codes corresponding to the input signals. Inputting the cyclic thermometer codes into the encode circuit according to the present embodiment gives a desired lower-order three-bit output.

To which of the four reference voltage intervals (Vr1-Vr9, Vr9-Vr17, Vr17-Vr25, Vr25-Vr33) the input signal in FIG. 7 belongs is determined by the two bits of the higher-order bit converter. The final output of the five-bit A/D converter is obtained by synchronizing the higher-order two bits with the lower-order three bits given.

Figure 8:
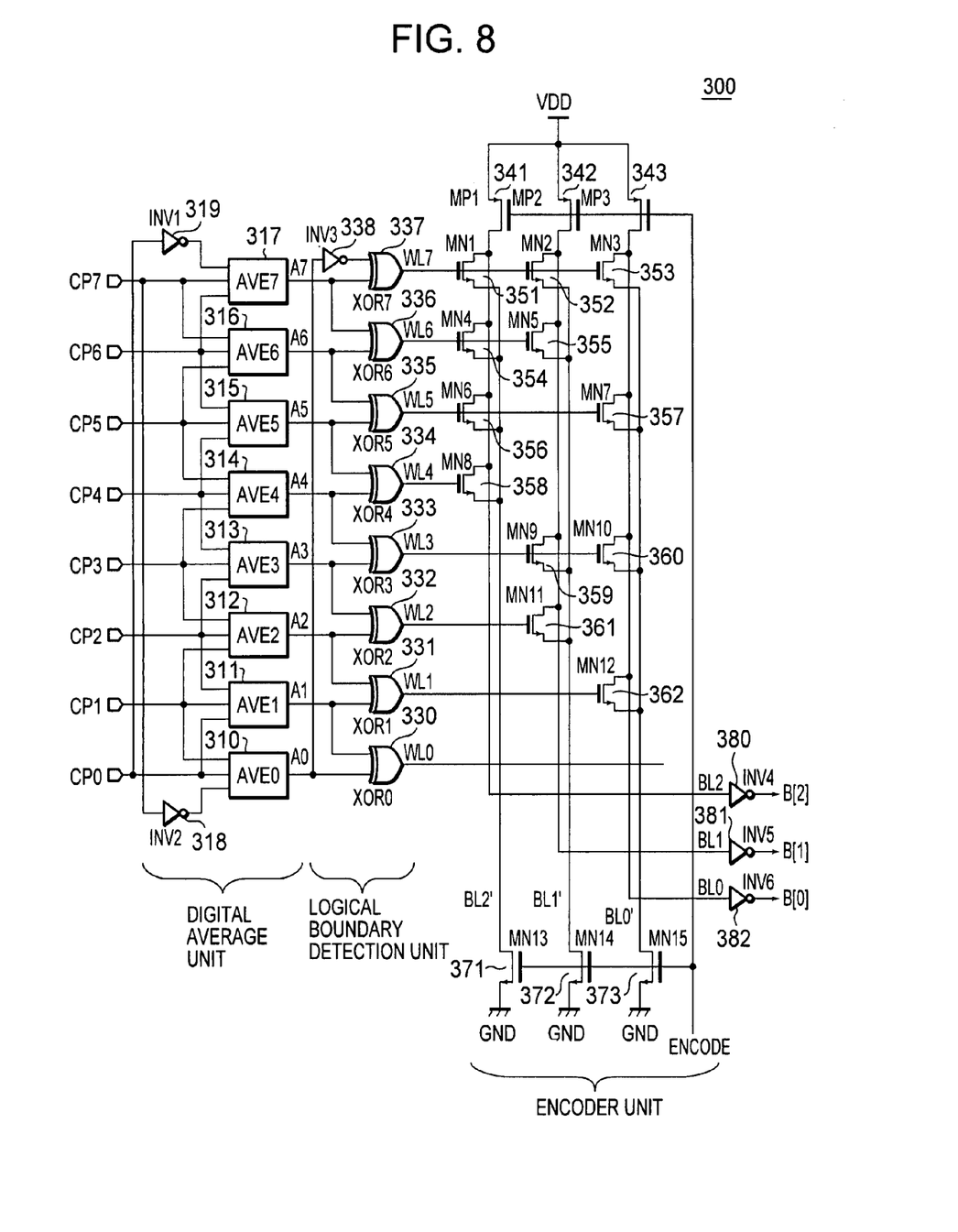
FIG. 8 is a diagram showing the circuit configuration of an encode circuit in FIG. 1.

Next, FIG. 8 shows an encode circuit 300 in the embodiment of the present invention.

The encode circuit 300, which performs logical operation for data output from the comparators to convert the data to binary code, includes a digital average unit (averaging circuit), a logical boundary detector unit, and an encoder unit. For convenience, the encode circuit (300) refers to the configuration from the comparator output to the encoder unit, and the encoder unit refers to a circuit that converts the output data form the logical boundary detector unit to binary code, in the description below.

Although the encode circuit 300 in FIG. 8 has a three-bit circuit configuration, this is exemplary only. The present invention is applicable to the configuration of any number of bits.

The digital average unit includes eight digital average (average; or majority vote rule) circuits, AVE0 (310) to AVE7 (317). The input of digital average circuit AVE0 (310) is connected to the output of comparators CP0 and CP1 and, at the same time, the output of comparator CP7 is connected to the input of circuit AVE0 (310) via an inverter INV2 (318). The output of the digital average circuit AVE0 (310) is connected to one of the inputs of XOR0 (330).

The input of digital average circuit AVE1 (311) is connected to the output of comparators CP0, CP1, and CP2, and the output is connected to one of the inputs of XOR (Exclusive OR circuit) 1 (331). The input of digital average circuit AVE2 (312) is connected to the output of comparators CP1, CP2, and CP3, and the output is connected to one of the inputs of XOR2 (332). The input of digital average circuit AVE3 (313) is connected to the output of comparators CP2, CP3, and CP4, and the output is connected to one of the inputs of XOR3 (333). The input of the digital average circuit AVE4 (314) is connected to the output of comparators CP3, CP4, and CP5, and the output is connected to one of the inputs of XOR4 (334). The input of digital average circuit AVE5 (315) is connected to the output of comparators CP4, CP5, and CP6, and the output is connected to one of the inputs of XOR5 (335). The input of digital average circuit AVE6 (316) is connected to the output of comparators CP5, CP6, and CP7, and the output is connected to one of the inputs of XOR6 (336). The input of digital average circuit AVE7 (317) is connected to the output of comparators CP6 and CP7 and, via INV1 (319), to the output of comparator CP0. The output of digital average circuit AVE7 (317) is connected to one of the inputs of XOR (Exclusive OR circuit) 7 (337).

As described above, not only the output of comparators CP0 and CP1, but also the inverted output of the highest-level comparator CP7 is connected to the input of the lowest-level digital average circuit AVE0 (310). Also, not only the output of comparators CP6 and CP7 but also the inverted output of the lowest-level comparator CP0 is connected to the input of the highest-level digital average circuit AVE7 (317).

The logical boundary detection unit includes eight XOR circuits (330-337).

The input of XOR (Exclusive OR circuit) 0 (330) is connected to the output of the digital average circuits AVE0 (310) and AVE1 (311), and the output is connected to word line WL0. The input of XOR 1 (331) is connected to the output of digital average circuits AVE1 (311) and AVE2 (312), and the output is connected to word line WL1. The input of XOR2 (332) is connected to the output of digital average circuits AVE2 (312) and AVE3 (313), and the output is connected to word line WL2. The input of XOR 3 (333) is connected to the output of digital average circuits AVE3 (313) and AVE4 (314), and the output is connected to word line WL3. The input of XOR4 (334) is connected to the output of digital average circuits AVE4 (314) and AVE5 (315), and the output is connected to word line WL4. The input of XOR 5 (335) is connected to the output of digital average circuits AVE5 (315) and AVE 6(316), and the output is connected to word line WL5. The input of XOR 6 (336) is connected to the output of digital average circuits AVE6 (316) and AVE7 (317), and the output is connected to word line WL6. The input of XOR7 (337) is connected to the output of digital average circuit AVE7 (317) and, via inverter INV3 (338), to the output of digital average circuit AVE0 (310), and the output is connected to work line WL7.

Next, the following describes the circuit configuration of the encoder unit.

The encoder unit has a memory-like structure, and includes NMOS transistors MN1 (351)-MN15 (373) and PMOS transistors MP1 (341)-MP3 (343).

The source of the PMOS transistor MP1 (341) is connected to the power supply (VDD), the gate is connected to the Encode line, and the drain is connected to bit line BL2. This bit line BL2 is connected to the input of inverter INV4 (380), and the higher-order three-bit data B[2] is output from the output of INV4 (380). Bit line BL2' is connected to the drain of NMOS transistor MN13 (371), the gate of this MN13 (371) is connected to the Encode line, and the source is connected to the ground.

Similarly, the source of PMOS transistor MP2 (342) is connected to the power supply (VDD), the gate is connected to the Encode line, and the drain is connected to bit line BL1. This bit line BL1 is connected to the input of inverter INV5 (381), and the second bit data B[1] is output from the output of INV5 (381). Bit line BL1' is connected to the drain of NMOS transistor MN14 (372), the gate of this MN14 (372) is connected to the Encode line, and the source is connected to the ground.

The source of PMOS transistor MP3 (343) is connected to the power supply (VDD), the gate is connected to the Encode line, and the drain is connected to bit line BL0. This bit line BL0 is connected to the input of inverter INV6 (382), and the lower-order bit data B[0] is output from the output of INV6 (382). Bit line BL0' is connected to the drain of NMOS transistor MN15 (373), the gate of this MN15 (373) is connected to the Encode line, and the source is connected to the ground.

Word line WL0, which represents all 0, is not connected to an NMOS transistor. Word line WL1 is connected to the gate of NMOS transistor MN12 (362), the drain of this NMOS transistor MN12 (362) is connected to bit line BL0, and the source is connected to bit line BL0'. Similarly, word line WL2 is connected to the gate of NMOS transistor MN11 (361), the drain of this MN11 (361) is connected to bit line BL1, and the source is connected to bit line BL1'. Word line WL3 is connected to the gates of NMOS transistors MN9 (359) and MN10 (360), the drain of MN9 (359) is connected to bit line BL1, the source is connected to bit line BL1', the drain of MN10 (360) is connected to bit line BL0, and the source is connected to bit line BL0'. Word line WL4 is connected to the gate of NMOS transistor MN8 (358), the drain of this MN8 (358) is connected to bit line BL12, and the source is connected to bit line BL2'. Word line WL5 is connected to the gates of NMOS transistors MN6 (356) and MN7 (357), the drain of MN6 (356) is connected to bit line BL2, the source is connected to bit line BL2', the drain of MN7 (357) is connected to bit line BL0, and the source is connected to bit line BL0'. Word line WL6 is connected to the gates of NMOS transistors MN4 (354) and MN5 (355), the drain of MN4 (354) is connected to bit line BL2, the source is connected to bit line BL2', the drain of MN5 (355) is connected to bit BL1, and the source is connected to bit line BL1'. Word line WL7 is connected to the gates of NMOS transistors MN1 (351), MN2 (352), and MN3 (353), the drain of MN1 (351) is connected to bit line BL2, the source is connected to bit line BL2', the drain of MN2 (352) is connected to bit line BL1, the source is connected to bit line BL1', the drain of MN3 (353) is connected to bit line BL0, and the source is connected to bit line BL0'.

As described above, the encode circuit 300 includes the digital average unit that receives the thermometer codes output from the eight comparators CP0-CP7 to reduce bubble errors in the code, the logical boundary detection unit that detects the changing point between 1 and 0 in the thermometer codes, and the encoder unit that generates 3-bit code based on the output signal from the logical boundary detection unit. The digital average unit and the logical boundary detection unit in this embodiment are created by dividing the function of the logical boundary detection unit, shown in the related art example in FIG. 15, into two.

The digital average unit described above, which includes eight 3-input logical circuits AVE0 (310)-AVE7 (317), each of which receives continuous three codes of thermometer codes CP0-CP7. The low-end AVE0 (310) receives CP0, CP1, and the signal generated by inverting CP7 by inverter INV2 (318), and the high-end AVE7 (317) receives CP6, CP7, and the signal generated by inverting CP0 by inverter INV1 (319).

Figure 9:
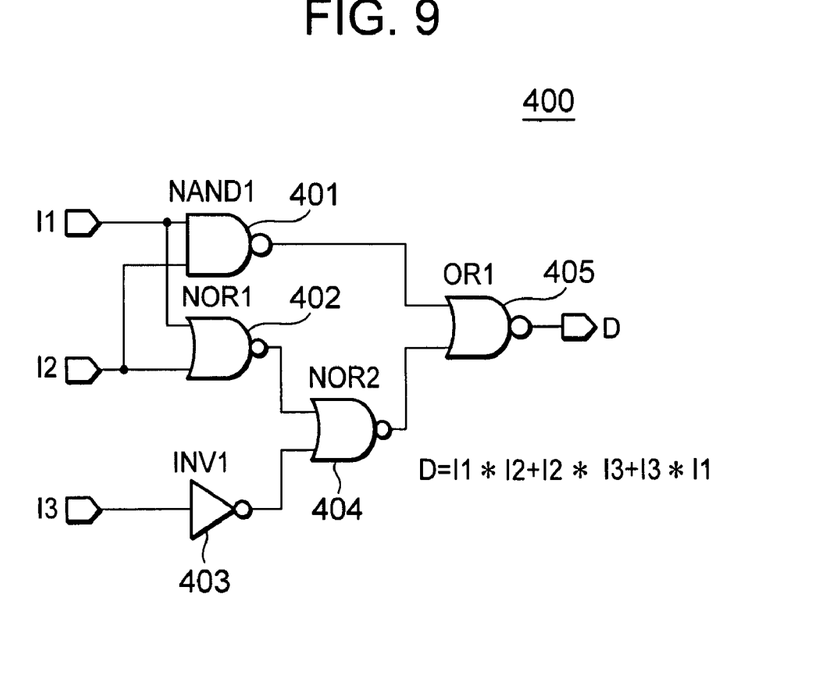
FIG. 9 is a diagram showing the circuit configuration of a digital average circuit in FIG. 8.

Next, FIG. 9 shows an example of the circuit configuration of a digital average circuit 400.

The digital average circuit 400 having the configuration of a three-input logical circuit, shown in FIG. 9, corresponds to AVE0 (310)-AVE7 (317) in FIG. 8. Each of AVE0 (310)-AVE7 (317) includes two NOR circuits NOR1 (402) and NOR2 (404), inverter INV1 (403), OR circuit OR1 (405), and NAND circuit NAND1 (401).

The input of NAND1 (401) is connected to the input terminals to which I1 and I2 are supplied, and the output is connected to the input of OR1 (405). The input of NOR1 (402) is connected to the input terminals to which I1 and I2 are supplied, and the output is connected to the input of NOR2 (404). The input of the INV1 (403) is connected to the terminal to which input signal I3 is supplied, and the output is connected to the input of NOR2 (404). The input of NOR2 (404) is connected to the output of INV1 (403) and the output of NOR1 (402), and the output is connected to the input of OR1 (405).

The input of OR1 (405) is connected to the outputs of NAND1 (401) and NOR2 (404), and the calculation result D is output from the output.

Figure 10:
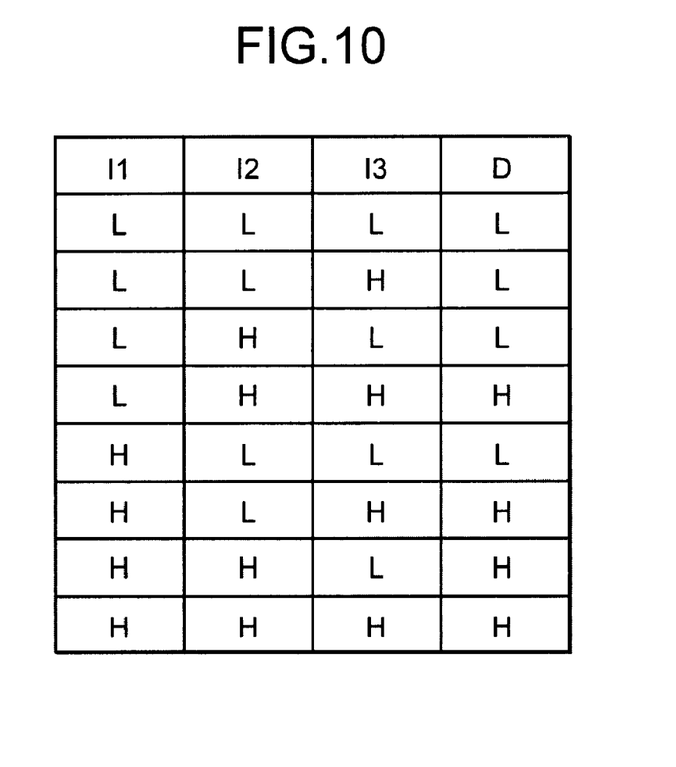
FIG. 10 is a logic table showing the operation of the digital average circuit in FIG. 9.

As shown in the truth table in FIG. 10, this three-input logical circuit is a majority vote rule circuit where the H level is output at the output D if two or more of the three inputs I1-I3 are at the "H" level and the L level is output at the output D if two or more inputs are at the "L" level.

Figure 11:
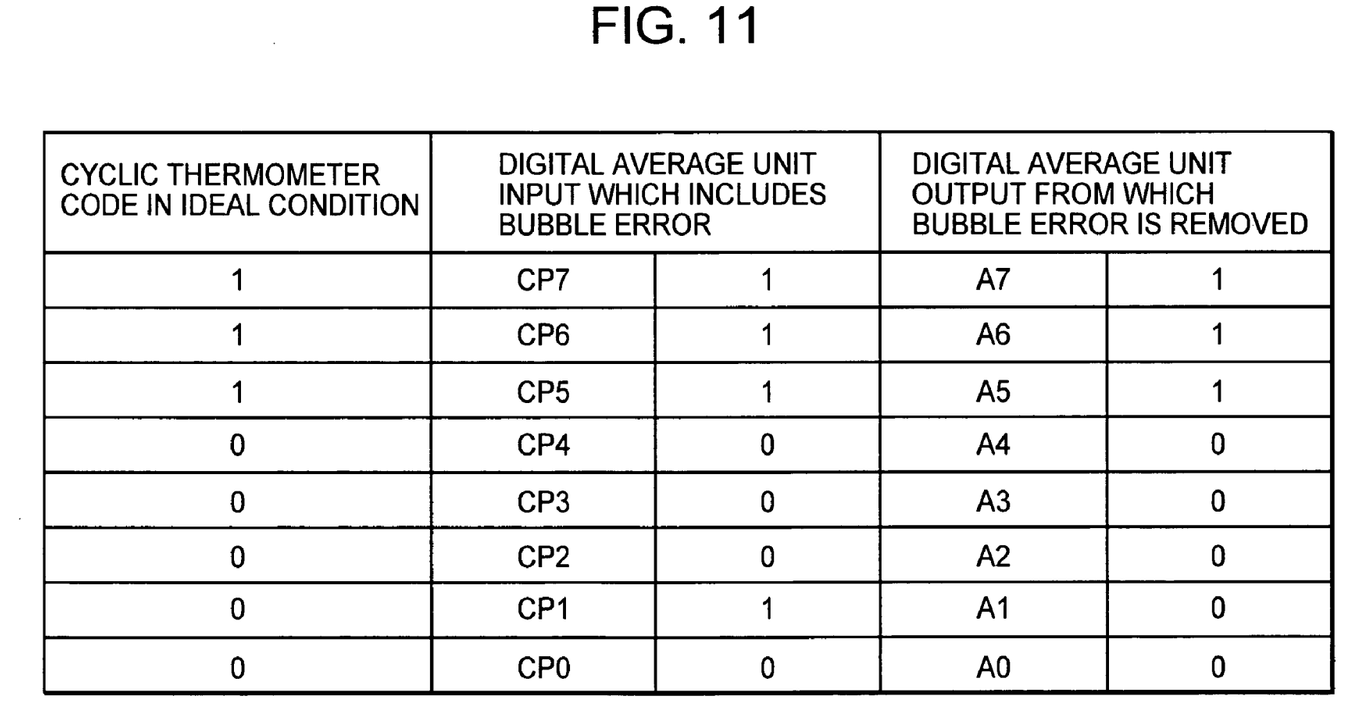
FIG. 11 is another logic table showing the operation of the digital average circuit in FIG. 9.

In this way, the majority decision is made for the three continuous codes of the thermometer codes and, in addition, the inverted signals of CP7 and CP0, corresponding respectively to the high-end and low-end of the cyclic code, are input to the input of the majority vote rule circuits AVE0 (310) and AVE7 (317) corresponding to the low-end and the high-end of the cyclic thermometer codes. Therefore, even if bubble errors specific to the cyclic thermometer codes, such as the one shown in FIG. 11 occur, and two logical boundaries are output in the related art example shown in FIG. 15, the circuit configuration described above produces one changing point between 1 and 0 and thus reduces the effect of the errors.

The logical boundary detection unit described above, which includes eight exclusive OR circuits XOR0 (330)-XOR7 (337) and one inverter INV3 (338), as shown in FIG. 8, receives the thermometer code output signals A0-A7 in which only one changing point between continuous 1s and continuous 0s is included due to the operation of the digital average unit described above. The logical exclusive OR (XOR) operation is performed for continuous two codes of the input signals. For example, when the eight codes A0-A7 are "11110000", only output word line WL3 is 1 because only XOR3 (332) has input values of 1 and 0 and, therefore, the logical boundary point between continuous 1s and continuous 0s is detected.

In addition, not only output A7 of AVE7 (317) but also the inverted signal of output A0 of AVE0 (310) is input to the input of XOR7 (337) corresponding to the higher-order A7 of the output of the digital average unit. This makes it possible for word line WL7 at the logical boundary point to be detected even when the codes, such as the cyclic thermometer codes, is filled with 1 beginning with the low end or filled with 0 beginning with the low end. For example, when A0-A7 are all 1s, word line WL7 at the logical boundary point can be detected because 1 and 0 are input to the XOR7 (337) and, even when A0-A7 are all 0s, word line WL7 at the logical boundary point can be detected because 0 and 1 are input to XOR7 (337).

The encoder unit includes PMOS transistors MP1 (341)-MP3 (343) for pre-charging bit lines BL0-BL2 to the power supply (VDD) voltage by setting the Encode signal to the L level, NMOS transistors MN13(371)-MN15(373) for pulling down bit lines BL0'-BL2' to GND (ground) by setting the Encode signal to the H level, NMOS transistors MN1(351)-MN12(362), connected to word lines WL0-WL7, for pulling down the predetermined bit lines to GND based on the H level output from the logical boundary detection unit, and inverters INV4(380)-INV6(382) that invert bit lines BL0-BL2 to give a desired binary output.

Therefore, when the Encode signal is set to the L level to pre-charge bit lines BL0-BL2 to VDD and, after that, word line WL3, which is the output of XOR3 (333), becomes the H level, NMOS transistors MN9 (353) and MN10 (354) are turned on, bit lines BL1 and BL0 are connected to GND and set to the L level, and bit lines BL1 and BL0 are inverted by inverters INV4 (382)-INV6(380) to output the output binary signal B[2:0]=011.

Figure 12:
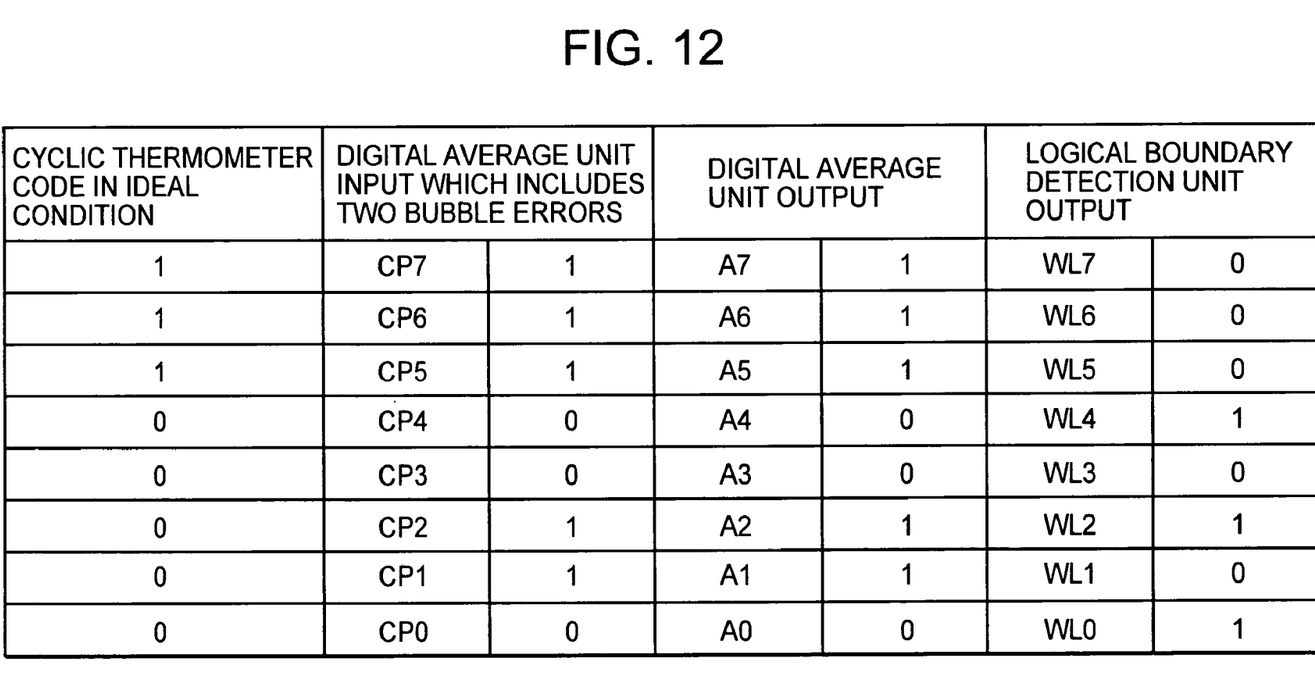
FIG. 12 is a logic table showing the operation of a logical boundary detection unit shown in FIG. 8.

However, even the digital average unit described above may not correct errors if two bubble errors are generated, as shown in FIG. 12. In this case, two or more output signals from the logical boundary detection unit become th H level. As a result, though the binary output should be B[2:0]=100, NMOS transistor MN8 (358) and MN11 (361) of the encoder unit in the embodiment shown in FIG. 8 are turned on at the same time, the binary output becomes B[2:0]=110, and a large error is generated in the output.

Figure 13:
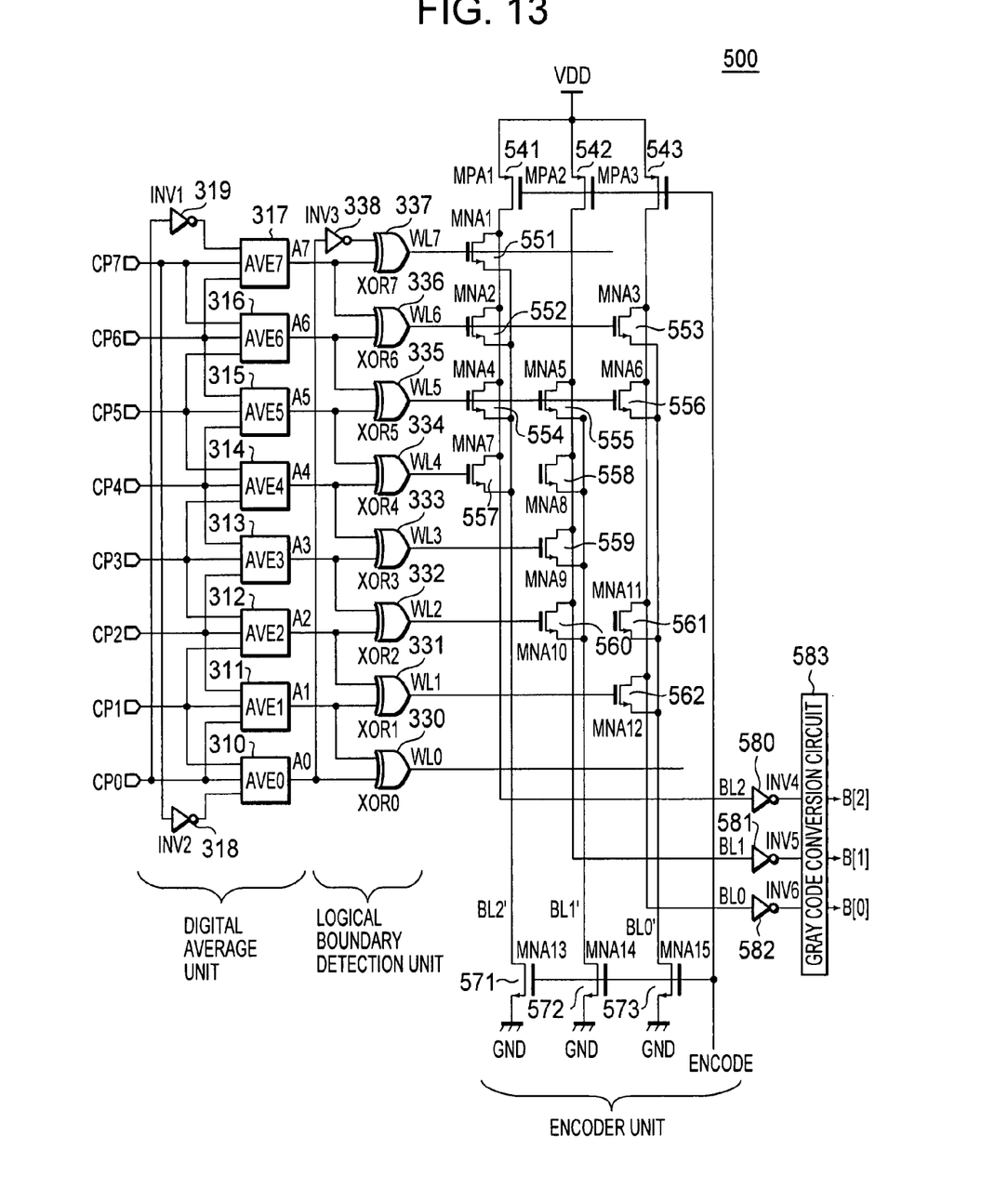
FIG. 13 is a diagram showing the circuit configuration of an encode circuit in a second embodiment.

FIG. 13 shows an encode circuit 500 in another embodiment in which not binary code but gray code is used in the encoder unit described above. In this embodiment, a new circuit, a Gray to Binary (gray code) conversion circuit 600, shown in FIG. 14, needs to be provided after the encoder unit.

The encode circuit 500 in FIG. 13 is similar to the encoder circuit 300 in FIG. 8 in the configuration of the digital average unit and the logical boundary detection unit but different in the configuration of the encoder circuit.

The description of the configuration of the digital average unit and the logical boundary detection unit is the same as the description of the corresponding units in FIG. 8 and so the description is omitted here. Referring to the circuit configuration of the encoder unit, only the connection relation of NMOS transistors MN1 (551)-MN12 (562) for encoding, which are connected to word lines WL0-WL7, is different.

Word line WL0, which outputs all H level data, is not connected to NMOS transistors. Word line WL1 is connected to the gate of NMOS transistor MNA12 (562), the drain of this MNA12 (562) is connected to bit line BL0, and the source is connected to bit line BL0'. Word line WL2 is connected to the gates of NMOS transistors MNA10 (560) and MNA11 (561), the drain of this MNA10 (560) is connected to bit line BL1, and the source is connected to bit line BL1'. The drain of MNA11 (561) is connected to bit line BL0, and the source is connected to bit line BL0'. Word line WL3 is connected to the gate of NMOS transistor MNA9 (559), the drain of MNA9 (559) is connected to bit line BL1, and the source is connected to bit line BL1'. Word line WL4 is connected to the gates of NMOS transistors MNA7 (557) and MNA8 (558), the drain of MNA7 (557) is connected to bit line BL2, the source is connected to bit line BL2', the drain of MNA8 (558) is connected to bit line BL1, and the source is connected to bit line BL1'. Word line WL5 is connected to the gates of NMOS transistors MNA4 (554), MNA (555), and MNA6 (556), the drain of MNA4 (554) is connected to bit line BL2, the source is connected to bit line BL2', the drain of MNA5 (555) is connected to bit line BL1, the source is connected to bit line BL1', the drain of MNA6 (556) is connected to bit line BL0, and the source is connected to bit line BL0'. Word line WL6 is connected to the gates of NMOS transistors MNA2 (552) and MNA3 (553), the drain of MNA2 (552) is connected to bit line BL2, the source is connected to bit line BL2', the drain of MNA3 (553) is connected to bit line BL0, and the source is connected to bit line BL0'. Word line WL7 is connected to the gate of NMOS transistor MNA1 (551), the drain of MNA1 (551) is connected to bit line BL2, and the source is connected to bit line BL2'. The other circuit configuration is the same as that in FIG. 8.

Next, the following describes the operation of the encode circuit 500 shown in FIG. 13. For example, when the Encode signal is set to the L level to pre-charge bit lines BL0-BL2 to VDD and, after that, word line WL3, which is the output of XOR3 (333), becomes the H level, NMOS transistor MNA9 (559) is turned on and bit line BL1 is connected to GND and becomes the L level. As a result, bit line BL2 becomes the H level, bit line BL1 becomes the L level, and bit line BL0 becomes the H level, and the data is inverted by inverters INV4(580)-INV6(582) to output the output gray code signal B[2:0]=010.

Figure 14:
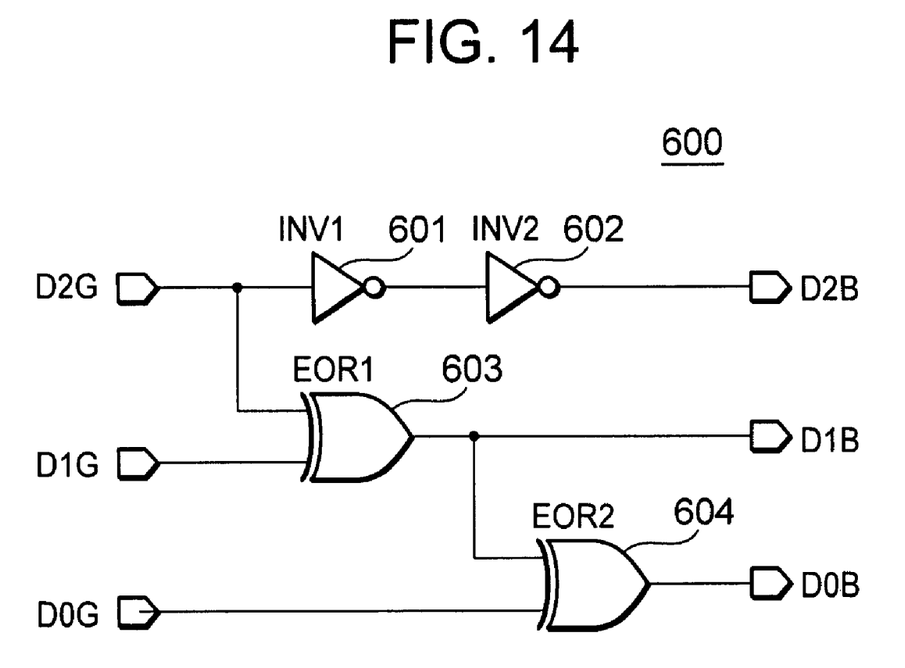
FIG. 14 is a diagram showing a gray-binary conversion circuit shown in FIG. 13.

Because B[D2G, D1G, D0G]=010 in FIG. 14, the operation based on the logical circuit causes the Gray to Binary (gray code) conversion circuit 600(583) to output D2B=0, D1B=1, and D0B=1, meaning that the binary data B[2:0]=011 is reproduced.

This gray code conversion circuit 600 receives D2G-D0G beginning with the higher-order side of gray code and produces binary code output D2B-D0B that becomes the output B[2:0] of the encode circuit.

Another example of operation is as follows. Even if a bubble error is included in the output of the digital average unit as a result of using gray code, as shown in FIG. 12, and, as a result, word lines WL2 and WL4 become the H level at the same time, bit lines BL0-BL2 all become the L level in this case and the output of INV4(580)-INV6(582) becomes [2:0]=111 because of the gray code characteristics that there is only one changing point between 1 and 0 in the neighboring codes. In addition, because the binary output generated by the Gray to Binary (gray code) conversion circuit 583 becomes B[2:0]=101, the error is minimized for the binary output [2:0]=100 that is supposed to be output.

As described above, the encode circuit of the present invention performs the operation at a high speed. In addition, the use of the cyclic thermometer codes, used for a folding-type A/D converter whose resolution can be increased more easily than a flash-type A/D converter, can reduce a bubble error specific to the cyclic thermometer codes.

The circuit configuration of this encode circuit can be implemented by an extremely small logic circuit, and the circuit can be used directly for the standard thermometer codes. Therefore, the encode circuit can perform conversion speedily and reliably for various types of A/D conversion method.

It should be understood by those skilled in the art that various modifications, combinations, sub-combinations and alterations may occur depending on design requirements and other factors insofar as they are within the scope of the appended claims or the equivalents thereof.

What is claimed is:

1. An encode circuit comprising:
   a digital average unit that receives cyclic thermometer codes or standard thermometer codes, and that reduces a bubble error in the received thermometer codes by a majority vote rule;
   a logical boundary detection unit that detects a logical boundary in the thermometer codes output from the digital average unit; and
   an encoder unit that generates output codes based on output signals from the logical boundary detection unit.

2. The encode circuit according to claim 1 wherein
   the digital average unit includes majority vote rule circuits, each of which outputting a most frequently occurring code out of three or more neighboring codes for each of the received thermometer codes,
   a highest-order majority vote rule circuit performs majority decision for a Most Significant Bit of the received thermometer codes, a neighboring bit thereof, and an inverted signal of a Least Significant Bit of the received thermometer codes, and
   a lowest-order majority vote rule circuit performs majority decision for the Least Significant Bit of the thermometer codes, a neighboring bit thereof, and an inverted signal of the Most Significant Bit of the received thermometer codes.

3. The encode circuit according to claim 1 wherein
the logical boundary detection unit includes 2-input exclusive OR logic circuits, each of which receives two neighboring codes of the thermometer codes output from the digital average unit, and
a highest-order one of the exclusive OR logic circuits receives a Most Significant Bit and an inverted Least Significant Bit of the output of the digital average unit.

4. The encode circuit according to claim 1 wherein
the encoder unit has a memory-like structure in which signals are received from the logical boundary detection unit via word lines and encoded output is output to bit lines, and
the encoder unit includes
transistors that pre-charge the bit lines to a power supply level at pre-charge time;
transistors that are turned on by corresponding word lines at encode time to set the bit lines to a ground level for providing a desired output; and
transistors that disconnect the bit lines from the ground level at pre-charge time.

5. An analog-digital converter including a first analog-digital conversion unit that outputs digital signals of a first bit group, the first analog-digital conversion unit comprising:
a resistor ladder, in which a plurality of resistors are connected, for generating reference voltages at connection points of the resistors;
folding circuits that generate folding waveforms corresponding to the reference voltages and an input signal, the reference voltages being supplied from the resistor ladder;
an interpolation circuit that interpolates outputs of the folding circuits that neighbor each other;
a comparator that determines a magnitude relation between outputs of the interpolation circuit;
a digital average unit that corrects an error in an output result of the comparator by a majority vote rule;
a logical boundary detection unit that detects a changing point in data output from the digital average unit; and
an encoder unit that converts data to binary codes according to an output of the logical boundary detection unit.

6. The analog-digital converter according to claim 5, further comprising:
a second analog-digital conversion unit that receives the input signal, compares the input signal with the reference voltages, converts the input signal to binary bits according to the comparison result, and outputs digital signals of a second bit group.

7. The analog-digital converter according to claim 5 wherein:
the first analog-digital conversion unit performs analog-digital conversion for a lower-order bit group and the second analog-digital conversion unit performs analog-digital conversion for a higher-order bit group.

8. The analog-digital converter according to claim 5 wherein
at least an output at a Most Significant Bit, an output at a neighboring bit, and an inverted output at a Least Significant Bit of the comparator are supplied to a highest-order processing unit of the digital average unit.

9. The analog-digital converter according to claim 5 wherein
at least an output at a Least Significant Bit, an output at a neighboring bit, and an inverted output at a Most Significant Bit of the comparator are supplied to a lowest-order processing unit of the digital average unit.

10. The analog-digital converter according to claim 5 wherein
an output of a highest-order processing unit of the digital average unit and an inverted output of a lowest-order processing unit of the digital average unit are supplied to a Most Significant Bit logical operation unit of the logical boundary detection unit.

11. The analog-digital converter according to claim 5 wherein
the folding circuits generate folding waveforms corresponding to the reference voltages output from the resistor ladder and the input signal.

12. The analog-digital converter according to claim 9 wherein
the interpolation circuit includes an N-time interpolation circuit (N is an integer equal to or larger than 2) that interpolates values output from neighboring folding circuits based on results output from the neighboring folding circuits.

13. The analog-digital converter according to claim 5, further comprising:
a gray-binary conversion circuit that processes an output of the encode circuit.

14. The analog-digital converter according to claim 6 wherein:
the first analog-digital conversion unit performs analog-digital conversion for a lower-order bit group and the second analog-digital conversion unit performs analog-digital conversion for a higher-order bit group.

15. An encode circuit comprising:
digital average means for receiving cyclic thermometer codes or standard thermometer codes, and reducing a bubble error in the received thermometer codes by a majority vote rule;
logical boundary detection means for detecting a logical boundary in the thermometer codes output from the digital average means; and
encoder means for generating output codes based on output signals from the logical boundary detection means.

* * * * *